United States Patent
Quigley et al.

(10) Patent No.: US 9,671,453 B2
(45) Date of Patent: Jun. 6, 2017

(54) BUILT IN TEST CIRCUIT FOR TRANSIENT VOLTAGE SUPPRESSOR DEVICES

(71) Applicant: HAMILTON SUNDSTRAND CORPORATION, Charlotte, NC (US)

(72) Inventors: James Quigley, South Hamilton, MA (US); Gary L. Hess, Enfield, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 101 days.

(21) Appl. No.: 14/503,937

(22) Filed: Oct. 1, 2014

(65) Prior Publication Data

US 2016/0097803 A1    Apr. 7, 2016

(51) Int. Cl.
| | | |
|---|---|---|
| G01R 31/00 | (2006.01) | |
| G01R 31/28 | (2006.01) | |
| G01R 19/00 | (2006.01) | |
| H02H 9/04 | (2006.01) | |

(52) U.S. Cl.
CPC ..... *G01R 31/2827* (2013.01); *G01R 19/0084* (2013.01); *H02H 9/042* (2013.01); *H02H 9/041* (2013.01)

(58) Field of Classification Search
CPC .................... G01R 31/2827; G01R 19/0084
USPC ............. 324/750.3, 750.15, 762.01–762.03, 324/762.08–762.09, 131, 537, 76.11; 361/56, 119, 127, 111
See application file for complete search history.

(56) References Cited

U.S. PATENT DOCUMENTS

| | | | | |
|---|---|---|---|---|
| 5,914,662 A | * | 6/1999 | Burleigh ................ | H02H 9/042 340/635 |
| 6,266,223 B1 | * | 7/2001 | Curry ..................... | H02H 9/042 361/119 |
| 8,649,149 B1 | | 2/2014 | Smith et al. | |
| 2005/0190514 A1 | * | 9/2005 | Walters ................. | H01L 29/868 361/56 |
| 2006/0152877 A1 | * | 7/2006 | Buzzard ................. | H02H 9/047 361/118 |
| 2012/0236447 A1 | | 9/2012 | Mack et al. | |
| 2014/0306714 A1 | * | 10/2014 | Hess ..................... | H02H 9/042 324/537 |
| 2014/0377940 A1 | * | 12/2014 | Huang ................ | H01L 27/0814 438/526 |

OTHER PUBLICATIONS

Extended European Search Report for European Patent Application No. 15184595.5, dated Mar. 1, 2016, 7 pages.

* cited by examiner

*Primary Examiner* — Thang Le
(74) *Attorney, Agent, or Firm* — Kinney & Lange, P.A.

(57) ABSTRACT

A built-in test system includes a control circuit, a transient voltage suppressor circuit, and a test switch. The control circuit is configured to receive a signal, and the transient voltage suppressor circuit includes first and second transient voltage suppressors connected in series between the signal and ground. The test switch is connected to selectively conduct current between the signal and a node between the first and second transient voltage suppressors. The control circuit is configured to control the test switch to test the first and second transient voltage suppressors.

18 Claims, 3 Drawing Sheets

BUILT IN TEST CIRCUIT FOR TRANSIENT VOLTAGE SUPPRESSOR DEVICES

BACKGROUND

The present invention relates generally to transient voltage suppressor (TVS) devices, and specifically to a system and method for performing built-in test (BIT) of TVS devices.

TVS devices are often utilized, for example, to protect circuitry from lightning strikes and other transients. TVS devices are often used to protect control circuitry onboard aircraft from these high voltage/current transients. A TVS device will turn on at a certain voltage, depending on the specific device, and then clamp the signal line at that voltage, called the clamping voltage, and therefore protect any connected circuitry. Under normal operation, the TVS device does not affect the circuit operation. Often times, a higher clamping voltage is required which may necessitate multiple TVS devices to be configured in series, thus clamping the connected circuitry with a higher clamping voltage and ensuring that the TVS devices do not clamp during normal operation.

For series connected TVS devices onboard an aircraft, for example, it is not presently possible to verify proper functionality of TVS devices in-flight. It is desirable to verify TVS device functionality in-flight to ensure proper functionality prior to a transient event.

SUMMARY

A built-in test system includes a control circuit, a transient voltage suppressor circuit, and a test switch. The control circuit is configured to receive a signal, and the transient voltage suppressor circuit includes first and second transient voltage suppressors connected in series between the signal and ground. The test switch is connected to selectively conduct current between the signal and a node between the first and second transient voltage suppressors. The control circuit is configured to control the test switch to test the first and second transient voltage suppressors.

A method includes controlling, by a control circuit, a test switch to an OFF state to deny current from a signal to a node between first and second transient voltage suppressors. The first and second transient voltage suppressors are connected in series between the first signal and ground. The method further includes sampling, by the control circuit, a first sample voltage value at the node, controlling, by the control circuit, the test switch to an ON state to conduct current from the signal to the node, sampling, by the control circuit, a second sample voltage value at the node, and verifying, by the control circuit, functionality of the first and second transient voltage suppressors based upon the first and second sample voltages values.

DETAILED DESCRIPTION

A built-in test system and method is disclosed herein for verifying operation of transient voltage suppressor (TVS) devices. Protection circuits for lightning and other high voltage/current transients onboard aircraft, for example, include a plurality of TVS devices configured in series between an operating signal and ground. A switch may be operably connected between the operating signal and a node between two of the plurality of TVS devices. The voltage at that node is provided as an input to the control circuit. The control circuit may first sample the wraparound voltage while the switch is in an OFF state. The control circuit may then turn the switch to an ON state and again sample the wraparound voltage. The first sampled voltage is compared with a first expected voltage value and the second sampled voltage is compared with a second expected voltage value. These expected voltage values may be calculated by the control circuit. The functionality of the TVS devices may be determined based upon both the first and second comparisons. In this way, the operability of the TVS devices may be determined during system operation.

Figure 1:
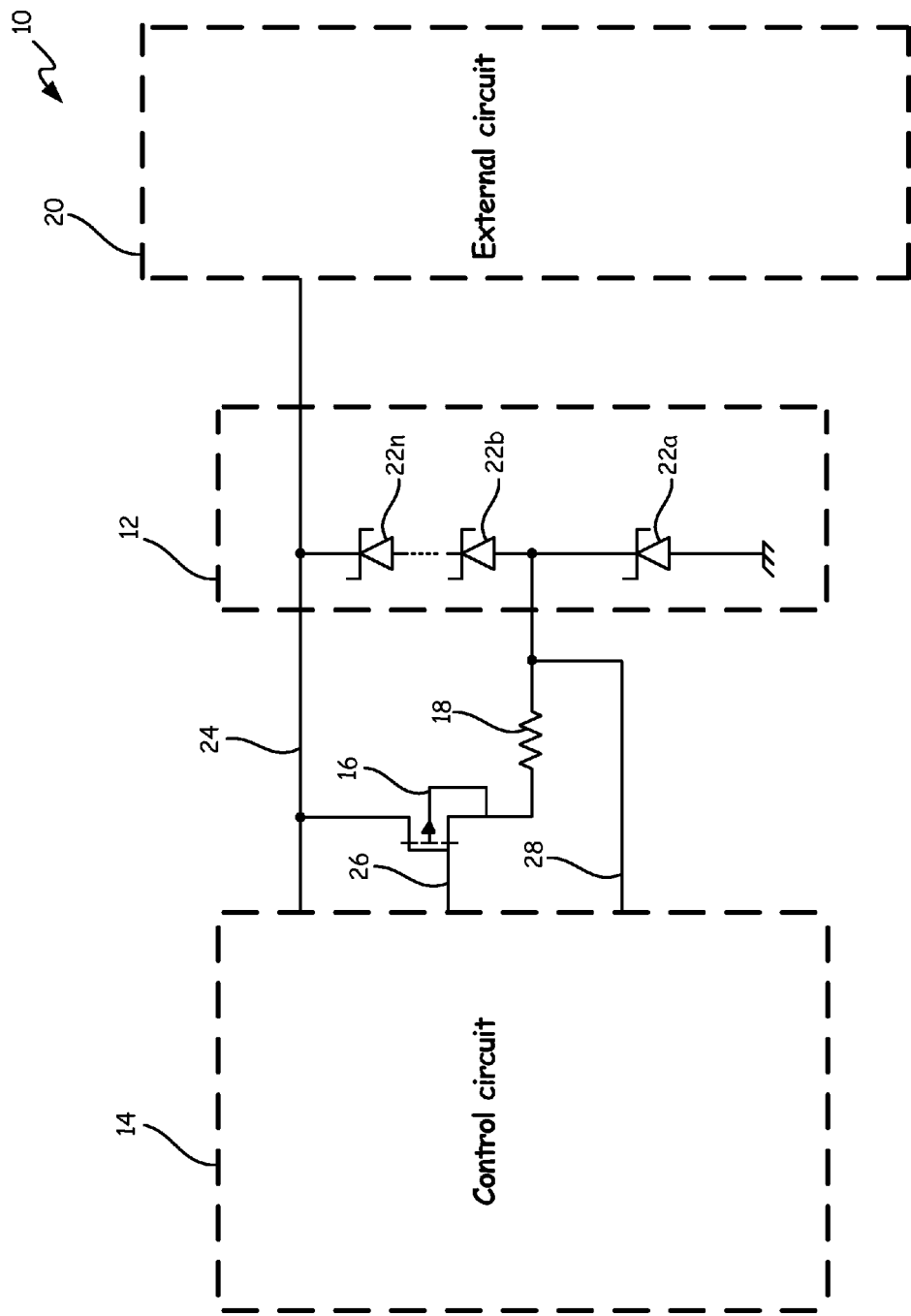
FIG. 1 is a circuit diagram illustrating a system for performing built-in test (BIT) for a transient voltage suppressor (TVS) device circuit.

FIG. 1 is a circuit diagram illustrating system 10 for performing built-in test (BIT) of TVS device circuit 12. System 10 includes TVS device circuit 12, control circuit 14, test switch 16, resistor 18, and external circuit 20. TVS circuit 12 includes TVS devices 22a-22n. Control circuit 14 includes signal input/output 24, BIT control output 26, and TVS wraparound 28. External circuit 20 also receives the signal on input/output 24. TVS devices 22a-22n are any transient voltage suppressors, such as, for example, TVS diodes (also known as Transzorbs®). Control circuit 14 is any electronic control system circuitry and may include, for example, a microprocessor, a field programmable gate-array (FPGA), an application specific integrated circuit (ASIC) and/or any other electronic circuit. Test switch 16 may be, for example, a metal-oxide-semiconductor field-effect transistor (MOSFET), insulated gate bipolar transistor (IGBT), or any other electrically controlled switch.

TVS device circuit 12 may be utilized, for example, to provide lightning or other high voltage/current transient protection for control circuit 14 and external circuit 20. Onboard aircraft, for example, lightning strikes may generate a large overvoltage within the electric systems. To accommodate these large voltage transients, TVS devices 22a-22n may be connected in series to create a desired clamping or standoff voltage. Several TVS devices 22a-22n may be utilized in order to achieve a sufficient standoff voltage and reduce the dissipated power of each TVS device 22a-22n. Therefore, the total number of devices 22a-22n that are utilized in TVS device circuit 12 may be determined by, for example, the breakdown voltage of each device 22a-22n and the desirable clamping voltage for system 10. Each device 22a-22n may have a similar breakdown voltage, or each device 22a-22n may be sized differently depending upon the specific application.

Test switch 16 is implemented to provide built-in test (BIT) for TVS device circuit 12. In the embodiment illustrated in FIG. 1, test switch 16 is a MOSFET and connected to selectively allow current to flow from signal input/output 24, through resistor 18 and through TVS device 22a to ground. BIT control output 26 is provided to the gate of test switch 16, the voltage at signal input/output 24 is connected to the drain of test switch 16, and resistor 18 is connected to the source of test switch 16. Resistor 18 is connected between the source of test switch 16 and TVS wraparound 28. Resistor 18 is any resistor and may be selected such that the resistance provides desirable current draw and power dissipation for system 10.

During normal system operation, BIT control output 26 is such that test switch 16 is in an OFF state. For example, BIT control output 26 may be active low such that test switch 16 is in an OFF state and does not conduct between its source and drain. When test switch 16 is in the OFF state, control circuit 14 may sample the voltage on TVS wraparound 28. Based upon the leakage current of TVS devices 22a-22n and the voltage on signal input/output 24, a first voltage value may be determined for the wraparound voltage on TVS wraparound 28. Control circuit 14 may compare the actual voltage on TVS wraparound 28 with the first voltage value. If the voltage on TVS wraparound 28 is not within a range of the first voltage value, control circuit 14 indicates that the voltage ratio between TVS devices 22a-22n is incorrect.

Following test of TVS device circuit 12 while test switch 16 is OFF, control circuit 14 controls test switch 16 to the ON state to further test TVS device circuit 12. On output 26, control circuit 14 may, for example, provide an "active high" signal to turn test switch 16 to an ON state in order to conduct current from signal input/output 24 to TVS wraparound 28. Resistor 18 may be sized such that the current conducted through test switch 16 is high enough for TVS device 22a to exceed breakdown and conduct significant current. Therefore, a second expected voltage value on TVS wraparound 28 is the working voltage of TVS device 22a. Control circuit 14 compares the second expected voltage value with the actual voltage on TVS wraparound 28 to test the functionality of TVS device 22a. If the voltage on TVS wraparound 28 is not within a range of the second expected voltage value, control circuit 14 indicates a failed test.

Figure 2:
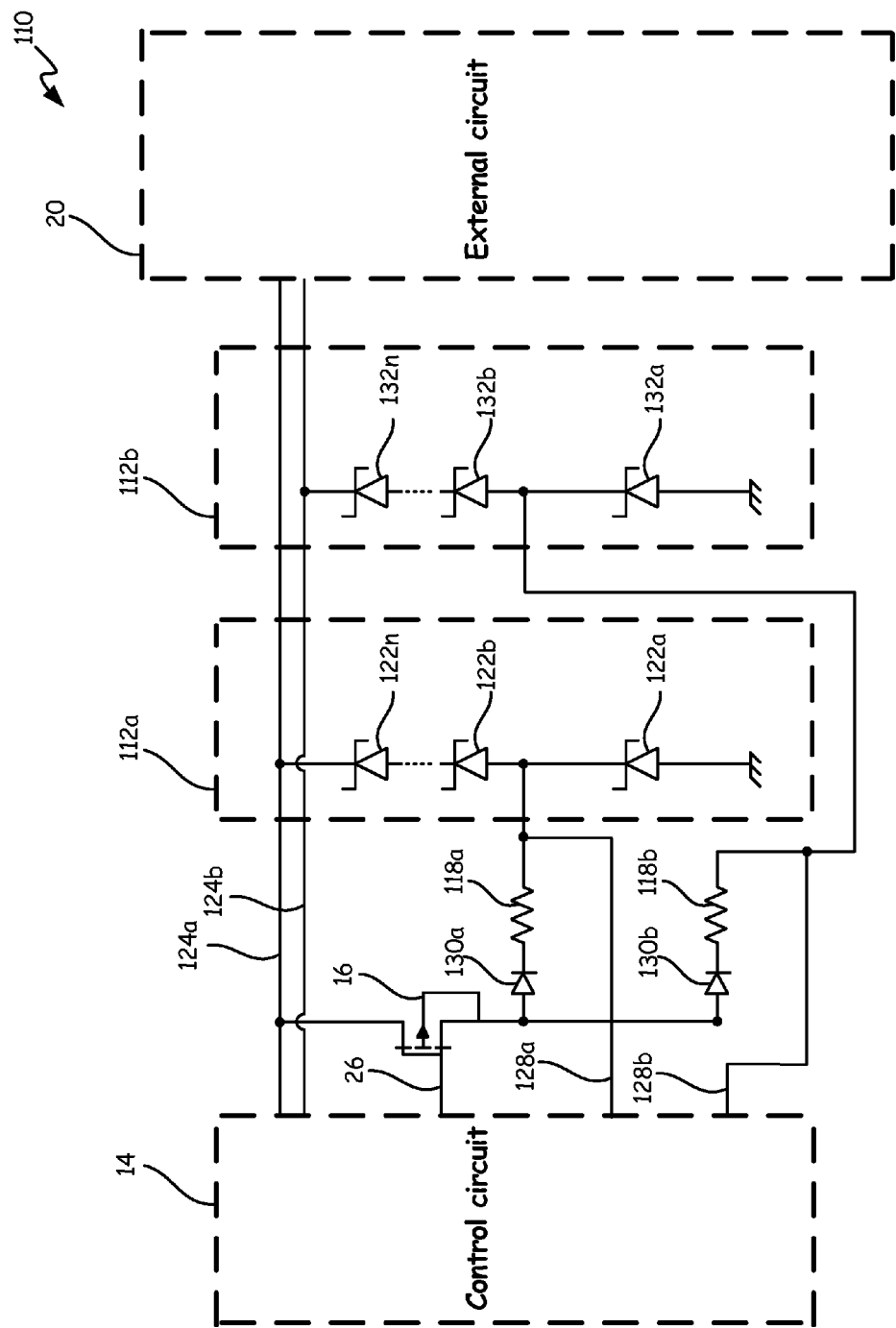
FIG. 2 is a circuit diagram illustrating a system for providing BIT for multiple TVS device circuits.

FIG. 2 is a circuit diagram illustrating system 110 for providing BIT for multiple TVS device circuits 112a and 112b. Common components between FIGS. 1 and 2 may be implemented in a similar manner. System 110 includes TVS device circuits 112a and 112b, control circuit 14, test switch 16, and external circuit 20. TVS device circuit 112a includes TVS devices 122a-122n and is implemented to protect circuitry connected to signal line 124a. TVS device circuit 112b includes TVS devices 132a-132n and is implemented to protected circuitry connected to signal line 124b. Diode 130a and resistor 118a are connected in series between the source of test switch 16 and TVS wraparound 128a. Diode 130b and resistor 118b are connected in series between the drain of test switch 16 and TVS wraparound 128b.

Diodes 130a and 130b are implemented such that both TVS device circuits 112a and 112b may be tested utilizing a single test switch 16. Voltage values may be determined for both TVS wraparounds 128a and 128b for both states of test switch 16. These values may be based at least in part upon the voltage on signal line 124a, leakage currents of TVS devices 122a-122n and 132a-132n and working voltages of TVS devices 122a-122n and 132a-132n. In this way, TVS device circuits 112a and 112b may be tested in a similar manner to that of the embodiment illustrated in FIG. 1.

Figure 3:
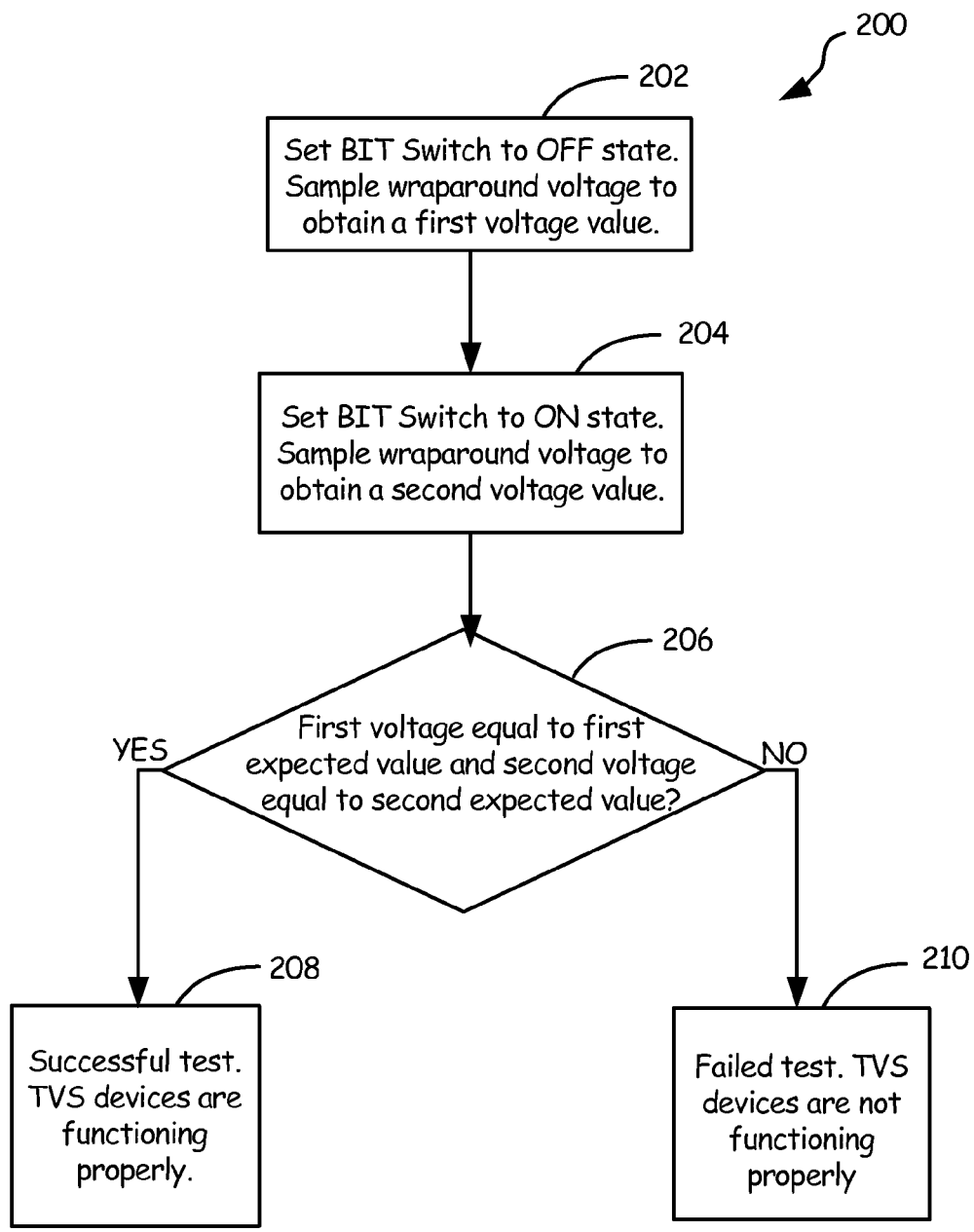
FIG. 3 is a flowchart illustrating a method of performing BIT for TVS device circuits.

With continued reference to FIG. 1, FIG. 3 is a flowchart illustrating method 200 of performing BIT for TVS device circuits. At step 202, control circuit 14 commands test switch 16 to an OFF state. Control circuit 14 samples a first voltage value at TVS wraparound 28. At step 204, control circuit 14 commands test switch 16 to an ON state. Control circuit 14 samples a second voltage value at TVS wraparound 28. At step 206, the first voltage value is compared to a first expected value and the second voltage value is compared to the second expected voltage value. If the first voltage value is within a range of the first expected voltage value and the second voltage value is within a range of the second expected voltage value, method 200 proceeds to step 208 and indicates a successful test. If the first voltage value is not within a range of the first expected voltage value and/or the second voltage value is not within a range of the second expected voltage value, method 200 proceeds to step 210 and indicates a failed test.

At step 210, a failed test may indicate various deficiencies in TVS device circuit 12. If the voltage on TVS wraparound 28 was within a range of the first expected voltage value while test switch 16 was OFF and the voltage on TVS wraparound 28 was not within a range of the second expected voltage value while test switch 16 was ON, then the voltage ratio of TVS devices 22a-22n is correct, but the BIT test was not successful. TVS devices 22a-22n may be implemented incorrectly, or TVS device 22a is damaged or degraded. If the voltage on TVS wraparound 28 was not within a range of the first expected voltage value while test switch 16 was OFF and the voltage on TVS wraparound 28 was within a range of the second expected voltage value while test switch 16 was ON, then the BIT test was unsuccessful. The voltage ratio between TVS devices 22a-22n is incorrect, but TVS device 22a is functioning properly. Therefore, one of TVS devices 22b-22n is not functioning properly. If the voltage on TVS wraparound 28 was not within a range of the first expected voltage value while test switch 16 was OFF and the voltage on TVS wraparound 28 was not within a range of the second expected voltage value while test switch 16 was ON, then BIT test was not successful. The voltage ratio of TVS devices 22a-22n is incorrect, and TVS device 22a is not functioning properly. Therefore, at least TVS device 22a is not functioning, but potentially several other TVS devices 22b-22n may also be functioning incorrectly.

Example Embodiment

The following equations may be utilized by control circuit 14 for an example implementation of the embodiment shown in FIG. 1 to determine first and second expected voltage values for TVS wraparound 28. These calculations assume only two transient voltage suppressors 22a and 22b in series.

The following values are defined:

$V_{A1}$ is the voltage drop across transient voltage suppressors 22b.

$V_{A2}$ is the voltage drop across transient voltage suppressor 22a.

$V_{W1}$ is the working voltage of voltage suppressors 22b.

$V_{W2}$ is the working voltage of transient voltage suppressor 22a.

$i_{leak}$ is the leakage current that will flow through transient voltage suppressors 22a and 22b.

$i_{leak,full}$ is the leakage current of transient voltage suppressors 22a and 22b over the full temperature range.

$V_{in}$ is the voltage on signal line 24.

$V_1$ is the voltage at TVS wraparound 28.

Using these definitions, the following equations may be utilized to determine first and second expected voltage values for TVS wraparound 28:

$$V_{A1} = V_{in} - V_1$$

$$V_{A2} = V_1$$

$$i_{leakfull} = i_{leakroom} \cdot \left[ 2^{\frac{T_{max}-25}{17}} \right]$$

$$i_{leak1} = i_{leakfull1} \cdot \left[ 0.2 \cdot \left( \frac{V_{A1}}{V_{W1}} \right) + 0.8 \cdot \left( \frac{V_{A1}}{V_{W1}} \right)^2 \right]$$

-continued $$i_{leak2} = i_{leakfull2} \cdot \left[ 0.2 \cdot \left( \frac{V_{A2}}{V_{W2}} \right) + 0.8 \cdot \left( \frac{V_{A2}}{V_{W2}} \right)^2 \right]$$

Because transient voltage suppressors 22a and 22b are in series, the leakage current through each will be equal. Therefore, by definition, $i_{leak1}$ must equal $i_{leak2}$. Therefore, it follows that:

$$i_{leak1} = i_{leak2}$$

$$i_{leakfull1} \cdot \left[ 0.2 \cdot \left( \frac{V_{A1}}{V_{W1}} \right) + 0.8 \cdot \left( \frac{V_{A1}}{V_{W1}} \right)^2 \right] =$$

$$i_{leakfull2} \cdot \left[ 0.2 \cdot \left( \frac{V_{A2}}{V_{W2}} \right) + 0.8 \cdot \left( \frac{V_{A2}}{V_{W2}} \right)^2 \right]$$

$$i_{leakfull1} \cdot \left[ 0.2 \cdot \left( \frac{V_{in} - V_1}{V_{W1}} \right) + 0.8 \cdot \left( \frac{V_{in} - V_1}{V_{W1}} \right)^2 \right] =$$

$$i_{leakfull2} \cdot \left[ 0.2 \cdot \left( \frac{V_1}{V_{W2}} \right) + 0.8 \cdot \left( \frac{V_{A1}}{V_{W2}} \right)^2 \right]$$

$$i_{leakfull1} \cdot \left( \frac{V_{in} - V_1}{V_{W1}} \right) + 4 \cdot i_{leakfull1} \cdot \left( \frac{V_{in} - V_1}{V_{W1}} \right)^2 =$$

$$i_{leakfull2} \cdot \left( \frac{V_1}{V_{W2}} \right) + 4 \cdot i_{leakfull2} \cdot \left( \frac{V_1}{V_{W2}} \right)^2$$

$$\left( \frac{i_{leakfull1} \cdot V_{in}}{V_{W1}} \right) - \left( \frac{i_{leakfull1}}{V_{W1}} \right) \cdot V_1 + \left( \frac{4 \cdot i_{leakfull1} \cdot V_{in}^2}{V_{W1}^2} \right) - \left( \frac{8 \cdot i_{leakfull1} \cdot V_{in}}{V_{W1}^2} \right) \cdot V_1 +$$

$$\left( \frac{4 \cdot i_{leakfull1}}{V_{W1}^2} \right) \cdot V_1^2 = \left( \frac{i_{leakfull2}}{V_{W2}} \right) \cdot V_1 + \left( \frac{4 \cdot i_{leakfull2}}{V_{W2}^2} \right) \cdot V_1^2$$

$$4 \cdot \left( \frac{i_{leakfull1}}{V_{W1}^2} - \frac{i_{leakfull2}}{V_{W2}^2} \right) \cdot V_1^2 - \left( \frac{i_{leakfull1}}{V_{W1}} + \frac{8 \cdot i_{leakfull1} \cdot V_{in}}{V_{W1}^2} + \frac{i_{leakfull2}}{V_{W2}} \right) \cdot V_1 +$$

$$\left( \frac{i_{leakfull1} \cdot V_{in}}{V_{W1}} + \frac{4 \cdot i_{leakfull1} \cdot V_{in}^2}{V_{W1}^2} \right) = 0$$

Let the following constants be defined:

$$\alpha = 4 \cdot \left( \frac{i_{leakfull1}}{V_{W1}^2} - \frac{i_{leakfull2}}{V_{W2}^2} \right)$$

$$\beta = -\left( \frac{i_{leakfull1}}{V_{W1}} + \frac{8 \cdot i_{leakfull1} \cdot V_{in}}{V_{W1}^2} + \frac{i_{leakfull2}}{V_{W2}} \right)$$

$$\gamma = \left( \frac{i_{leakfull1} \cdot V_{in}}{V_{W1}} \right) \cdot \left( 1 + \frac{4 \cdot V_{in}}{V_{W1}} \right)$$

Therefore, solving for $V_1$:

$$V_1 = \frac{-\beta + \sqrt{\beta^2 - 4 \cdot \alpha \cdot \gamma}}{2 \cdot \alpha} \text{ and } V_1 = \frac{-\beta - \sqrt{\beta^2 - 4 \cdot \alpha \cdot \gamma}}{2 \cdot \alpha}$$

One of these values will be out of range for the application and can be discarded. Control circuit 14 may utilize this value to determine a first expected voltage value for TVS wraparound 28 while test switch 16 is in an OFF state. The expected voltage value for TVS wraparound 28 while test switch 16 is in an ON state will be equal to the working voltage of transient voltage suppressor 22a. Using these two expected voltage values, control circuit 14 is able to test transient voltage suppressors 22a-22n during normal system operation.

Discussion of Possible Embodiments

The following are non-exclusive descriptions of possible embodiments of the present invention.

A built-in test system includes a control circuit, a transient voltage suppressor circuit, and a test switch. The control circuit is configured to receive a signal, and the transient voltage suppressor circuit includes first and second transient voltage suppressors connected in series between the signal and ground. The test switch is connected to selectively conduct current between the signal and a node between the first and second transient voltage suppressors. The control circuit is configured to control the test switch to test the first and second transient voltage suppressors.

The built-in test system of the preceding paragraph can optionally include, additionally and/or alternatively, any one or more of the following features, configurations and/or additional components:

A further embodiment of the foregoing built-in test system, wherein the control circuit is further configured to test the first and second transient voltage suppressors based upon a first sampled voltage value at the first node when the test switch is in an OFF state and based upon a second sampled voltage value at the first node when the test switch is in an ON state.

A further embodiment of any of the foregoing built-in test systems, wherein the control circuit is further configured to determine a first expected voltage value for the first node when the test switch is in the OFF position and a second expected voltage value for the first node when the test switch is in the ON position, and wherein the first and second expected voltage values are based upon the first signal and the first and second transient voltage suppressors.

A further embodiment of any of the foregoing built-in test systems, wherein the controller tests the first and second transient voltage suppressors by comparing the first sampled voltage value to the first expected voltage value and by comparing the second sampled voltage value to the second expected voltage value.

A further embodiment of any of the foregoing built-in test systems, wherein a first resistor is connected between an output of the test switch and the first node.

A further embodiment of any of the foregoing built-in test systems, wherein a third transient voltage suppressor is connected in series between the first signal and the first transient suppressor.

A further embodiment of any of the foregoing built-in test systems, wherein a third transient voltage suppressor is connected in series between the second transient voltage suppressor and the ground.

A further embodiment of any of the foregoing built-in test systems, further including a second transient voltage suppressor circuit comprising third and fourth transient voltage suppressors connected in series between a second signal and the ground. The test switch is connected to selectively conduct current between the first signal and a second node between the third and fourth transient voltage suppressors. The control circuit is further configured to test the third and fourth transient voltage suppressors based upon a third sampled voltage value at the second node when the test switch is in the OFF state and based upon a fourth sampled voltage value at the second node when the test switch is in the ON state.

A further embodiment of any of the foregoing built-in test systems, further including a first diode and first resistor connected in series between an output of the test switch and the first node, and a second diode and second resistor connected in series between the output of the test switch and the second node.

A further embodiment of any of the foregoing built-in test systems, wherein the first, second, third and fourth transient voltage suppressors are transient voltage suppression diodes.

A further embodiment of any of the foregoing built-in test systems, wherein the first and second transient voltage suppressor circuits are high voltage/current transients and/or lightning protection circuits for an aircraft.

A further embodiment of any of the foregoing built-in test systems, wherein the control circuit is configured to control the test switch to an OFF state during normal system operation.

A method includes controlling, by a control circuit, a test switch to an OFF state to deny current from a signal to a node between first and second transient voltage suppressors. The first and second transient voltage suppressors are connected in series between the first signal and ground. The method further includes sampling, by the control circuit, a first sample voltage value at the node, controlling, by the control circuit, the test switch to an ON state to conduct current from the signal to the node, sampling, by the control circuit, a second sample voltage value at the node, and verifying, by the control circuit, functionality of the first and second transient voltage suppressors based upon the first and second sample voltages values.

The method of the preceding paragraph can optionally include, additionally and/or alternatively, any one or more of the following features, configurations and/or additional components:

A further embodiment of the foregoing method, wherein controlling, by the control circuit, the test switch to the OFF state further comprises controlling the test switch to the OFF state to further deny current from the first signal to a second node between third and fourth transient voltage suppressors, and wherein the third and fourth transient voltage suppressors are connected in series between a second signal and ground. The method further includes sampling, by the control circuit, a third sample voltage value at the second node while the test switch is in the OFF state.

A further embodiment of any of the foregoing methods, wherein controlling, by the control circuit, the test switch to the ON state further comprises controlling the test switch to the ON state to further conduct current from the first signal to the second node. The method further includes sampling, by the control circuit, a fourth sample voltage value at the second node while the test switch is in the ON state, and verifying, by the control circuit, functionality of the third and fourth transient voltage suppressors based upon the third and fourth sample voltage values.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:
1. A built-in test system comprising:
   a control circuit configured to receive a first signal line;
   a first transient voltage suppressor circuit comprising first and second transient voltage suppressors connected in series between the first signal line and a ground; and
   a test switch connected to selectively conduct current between the first signal line and a first node between the first and second transient voltage suppressors, wherein the control circuit is configured to control the test switch to test the first and second transient voltage suppressors;
   wherein the control circuit is further configured to test the first and second transient voltage suppressors based upon a first sampled voltage value at the first node when the test switch is in an OFF state and based upon a second sampled voltage value at the first node when the test switch is in an ON state.

2. The built-in test system of claim 1, wherein the control circuit is further configured to determine a first expected voltage value for the first node when the test switch is in the OFF position and a second expected voltage value for the first node when the test switch is in the ON position, and wherein the first and second expected voltage values are based upon the first signal line and the first and second transient voltage suppressors.

3. The built-in test system of claim 2, wherein the controller tests the first and second transient voltage suppressors by comparing the first sampled voltage value to the first expected voltage value and by comparing the second sampled voltage value to the second expected voltage value.

4. The built-in test system of claim 1, wherein a first resistor is connected between an output of the test switch and the first node.

5. The built-in test system of claim 1, wherein a third transient voltage suppressor is connected in series between the first signal line and the first transient suppressor.

6. The built-in test system of claim 1, wherein a third transient voltage suppressor is connected in series between the second transient voltage suppressor and the ground.

7. The built-in test system of claim 1, further comprising:
   a second transient voltage suppressor circuit comprising third and fourth transient voltage suppressors connected in series between a second signal line and the ground;
   wherein the test switch is connected to selectively conduct current between the first signal line and a second node between the third and fourth transient voltage suppressors; and
   wherein the control circuit is further configured to test the third and fourth transient voltage suppressors based upon a third sampled voltage value at the second node when the test switch is in the OFF state and based upon a fourth sampled voltage value at the second node when the test switch is in the ON state.

8. The system of claim 7, further comprising:
   a first diode and a first resistor connected in series between an output of the test switch and the first node; and
   a second diode and a second resistor connected in series between the output of the test switch and the second node.

9. The built-in test system of claim 7, wherein the first, second, third and fourth transient voltage suppressors are transient voltage suppression diodes.

10. The built-in test system of claim 7, wherein the first and second transient voltage suppressor circuits are high voltage or current transient and lightning protection circuits for an aircraft.

11. The built-in test system of claim 1, wherein the control circuit is configured to control the test switch to an OFF state during normal system operation.

12. A method comprising:
controlling, by a control circuit, a test switch to an OFF state to deny current from a first signal line to a first node between first and second transient voltage suppressors, wherein the first and second transient voltage suppressors are connected in series between the first signal line and a ground;
sampling, by the control circuit, a first sample voltage value at the first node;
controlling, by the control circuit, the test switch to an ON state to conduct current from the first signal line to the first node;
sampling, by the control circuit, a second sample voltage value at the first node; and
verifying, by the control circuit, functionality of the first and second transient voltage suppressors based upon the first and second sample voltages values.

13. The method of claim 12, wherein controlling, by the control circuit, the test switch to the OFF state further comprises controlling the test switch to the OFF state to further deny current from the first signal line to a second node between third and fourth transient voltage suppressors, and wherein the third and fourth transient voltage suppressors are connected in series between a second signal line and the ground, and wherein the method further comprises:
sampling, by the control circuit, a third sample voltage value at the second node while the test switch is in the OFF state.

14. The method of claim 13, wherein controlling, by the control circuit, the test switch to the ON state further comprises controlling the test switch to the ON state to further conduct current from the first signal line to the second node, and wherein the method further comprises:
sampling, by the control circuit, a fourth sample voltage value at the second node while the test switch is in the ON state; and
verifying, by the control circuit, functionality of the third and fourth transient voltage suppressors based upon the third and fourth sample voltage values.

15. A built-in test system comprising:
a control circuit configured to receive a first signal line;
a first transient voltage suppressor circuit comprising first and second transient voltage suppressors connected in series between the first signal line and a ground;
a test switch connected to selectively conduct current between the first signal line and a first node between the first and second transient voltage suppressors, wherein the control circuit is configured to control the test switch to test the first and second transient voltage suppressors; and
a second transient voltage suppressor circuit comprising third and fourth transient voltage suppressors connected in series between a second signal line and the ground;
wherein the test switch is connected to selectively conduct current between the first signal line and a second node between the third and fourth transient voltage suppressors; and
wherein the control circuit is further configured to test the third and fourth transient voltage suppressors based upon a third sampled voltage value at the second node when the test switch is in the OFF state and based upon a fourth sampled voltage value at the second node when the test switch is in the ON state.

16. The system of claim 15, further comprising:
a first diode and a first resistor connected in series between an output of the test switch and the first node; and
a second diode and a second resistor connected in series between the output of the test switch and the second node.

17. The built-in test system of claim 15, wherein the first, second, third and fourth transient voltage suppressors are transient voltage suppression diodes.

18. The built-in test system of claim 15, wherein the first and second transient voltage suppressor circuits are high voltage or current transient and lightning protection circuits for an aircraft.

* * * * *